US007439165B2

United States Patent
Lo et al.

(10) Patent No.: US 7,439,165 B2
(45) Date of Patent: Oct. 21, 2008

(54) METHOD OF FABRICATING TENSILE STRAINED LAYERS AND COMPRESSIVE STRAIN LAYERS FOR A CMOS DEVICE

(75) Inventors: Patrick Guo Oiang Lo, Singapore (SG); Lakshmi Kanta Bera, Singapore (SG); Wei Yip Loh, Singapore (SG); Balakumar Subramanian, Singapore (SG); Narayanan Balasubramanian, Singapore (SG)

(73) Assignee: Agency for Sceince, Technology and Reasearch, Singapore (SG)

( * ) Notice: Subject to any disclaimer, the term of this patent is extended or adjusted under 35 U.S.C. 154(b) by 481 days.

(21) Appl. No.: 11/100,206

(22) Filed: Apr. 6, 2005

(65) Prior Publication Data
US 2006/0226483 A1    Oct. 12, 2006

(51) Int. Cl.
*H01L 21/22*    (2006.01)
*H01L 21/38*    (2006.01)

(52) U.S. Cl. .................. 438/558; 438/289; 438/479; 438/481; 438/752; 438/753; 438/770; 257/E21.09; 257/E21.097; 257/E21.099; 257/E21.135; 257/E21.152

(58) Field of Classification Search .......... 438/142, 438/197, 199, 218, 221, 479–481, 509, 510, 438/514, 517, 527, 530, 542, 549, 558, 564, 438/694, 765, 770, 289, 752, 753, 766, 933, 438/938; 257/E21.085, E21.09–E21.093, 257/E21.097, E21.099, E21.132, E21.135, 257/E21.14, E21.144, E21.152
See application file for complete search history.

(56) References Cited

U.S. PATENT DOCUMENTS 5,266,813 A    11/1993    Comfort et al. ............ 257/19

(Continued)

*Primary Examiner*—Carl Whitehead, Jr.
*Assistant Examiner*—Joseph C Nicely
(74) *Attorney, Agent, or Firm*—Saile Ackerman LLC; Stephen B. Ackerman

(57) ABSTRACT

A process for forming both tensile and compressive strained silicon layers to accommodate channel regions of MOSFET or CMOS devices has been developed. After formation of shallow trench isolation structures as well as application of high temperature oxidation and activation procedures, the fabrication sequences used to obtain the strained silicon layers is initiated. A semiconductor alloy layer is deposited followed by an oxidation procedure used to segregate a germanium component from the overlying semiconductor alloy layer into an underlying single crystalline silicon body. The level of germanium segregated into the underlying single crystalline silicon body determines the level of strain, which is in tensile state of a subsequently selectively grown silicon layer. A second embodiment of this invention features the thinning of a portion of the semiconductor alloy layer prior to the oxidation procedure allowing a lower level of germanium to be segregated into a first underlying portion of the underlying single crystalline silicon body, while during the same oxidation procedure a second portion of the underlying single crystalline silicon body receives a higher level of germanium segregation. So the subsequently deposited silicon-germanium layer, although the same process and thickness, can be strained in different states (tensile or compressive) and levels, depending different underlying portions' germanium concentration.

13 Claims, 7 Drawing Sheets

U.S. PATENT DOCUMENTS

| | | | |
|---|---|---|---|
| 5,308,785 A | 5/1994 | Comfort et al. | 437/67 |
| 6,429,061 B1 | 8/2002 | Rim | 438/198 |
| 6,673,696 B1 | 1/2004 | Arasnia et al. | 438/430 |
| 6,696,348 B1 | 2/2004 | Xiang | 438/424 |
| 6,821,828 B2* | 11/2004 | Ichijo et al. | 438/166 |
| 7,163,903 B2* | 1/2007 | Orlowski et al. | 438/752 |
| 7,183,168 B2* | 2/2007 | Matsuda et al. | 438/302 |
| 2004/0108559 A1* | 6/2004 | Sugii et al. | 257/411 |
| 2004/0137742 A1 | 7/2004 | Ngo et al. | 438/700 |
| 2004/0142537 A1 | 7/2004 | Lee et al. | 438/424 |
| 2004/0150042 A1 | 8/2004 | Yeo et al. | 257/347 |
| 2004/0164373 A1 | 8/2004 | Koester et al. | 257/499 |
| 2004/0180509 A1 | 9/2004 | Wang et al. | 438/424 |
| 2004/0209437 A1 | 10/2004 | Chiu et al. | 438/424 |
| 2004/0219767 A1* | 11/2004 | Arena et al. | 438/479 |
| 2005/0133834 A1* | 6/2005 | Sorada et al. | 257/288 |
| 2005/0227498 A1* | 10/2005 | Furukawa et al. | 438/758 |
| 2005/0285192 A1* | 12/2005 | Zhu | 257/347 |
| 2007/0178646 A1* | 8/2007 | Ramaswamy et al. | 438/269 |

* cited by examiner

METHOD OF FABRICATING TENSILE STRAINED LAYERS AND COMPRESSIVE STRAIN LAYERS FOR A CMOS DEVICE

BACKGROUND OF THE INVENTION (1) Field of the Invention

The present invention relates to methods used to fabricate semiconductor devices such as metal oxide semiconductor field effect (MOSFET) devices, and more specifically to devices formed with strained channel regions.

(2) Description of Prior Art

Enhanced performance of MOSFET devices has been addressed via device channel regions formed in strained layers. Increased carrier mobility and thus enhanced device performance has been achieved in both P channel (PMOS) as well as N channel (NMOS) structures via formation of channel regions in strained layers. Formation of strained layers such as a strained silicon layer can be accomplished by formation of the silicon layer on an underlying substrate or layer comprised of silicon-germanium or silicon-germanium carbon.

The magnitude of strain as well as the type of strain, tensile or compressive, is a function of the level of germanium in the underlying materials. To achieve the desired properties of the strained layer the underlying material, such as a silicon-germanium layer or alike substrate, has to remain stable and undisturbed during subsequent device processing, therefore the integration of the silicon-germanium layer or alike substrate into a MOSFET device process sequence has to be carefully implemented.

The present invention will describe process integration sequences in which the critical silicon-germanium material layer is not adversely effected by subsequent MOSFET processing steps such as formation of shallow trench isolation (STI) elements, or high temperature anneal procedures. Prior art such as Chiu et al in U.S. Pat. No. 2004/0209437 A1, Koester et al in U.S. Pat. No. 2004/0164373 A1, Ngo et al in U.S. Pat. No. 2004/0137742 A1, Wang et al in U.S. Pat. No. 2004/0180509 A1, as well as Comfort et al in U.S. Pat. No. 5,308,785, describe methods of forming isolation structures in strained silicon and in underlying silicon-germanium layers. The above prior art however does not teach the process integration sequence of the present invention in which specific process sequences such as STI formation are integrated into a MOSFET process without adverse consequence of the strained and underlying layers.

SUMMARY OF THE INVENTION

It is an object of this invention to form a MOSFET device featuring a channel region incorporated in a strained layer.

It is another object of this invention to form the strained layer and the underlying silicon-germanium bodies only after formation of STI structures.

It is still another object of this invention to form the underlying silicon-germanium bodies via batch deposition and oxidation procedures applied to an overlying silicon-germanium layer, followed by a selective epitaxial growth of the strained layer.

It is another object of this invention to allow formation of silicon-germanium (Si—Ge) in selective areas only, so hybrid structures for different circuit applications can be formed and integrated in the same wafer.

It is yet another object of this invention to form a complimentary metal oxide semiconductor (CMOS) device via formation of a tensile strained layer for a NMOS device, and of a compressive strained layer for a PMOS device.

It is yet a further object of this invention to optimize NMOS as well as PMOS devices in surface channel operating mode thus to achieve better Channel Electrostatic Control to minimize short channel effects.

In accordance with the present invention methods of forming strained layers for a MOSFET device in which the strained layers and overlying silicon-germanium layers are obtained after formation of specific device features such as STI, are described. A shallow trench isolation area is first defined by a composite layer of silicon nitride-silicon oxide, and in a top portion of either a silicon substrate or in a top portion of a Silicon on Oxide (SOI) substrate. Subsequent to patterning of silicon-nitride, silicon oxide, etching into then exposed silicon region, and formation of a silicon oxide liner layer on exposed silicon surfaces (e.g. sidewall, bottom, and top corners of future Si active areas), the desired STI structure is formed via insulator fill and chemical mechanical polishing (CMP) procedures. Silicon nitride removal and surface cleaning is followed by deposition or sputtering of a polycrystalline silicon-germanium layer. A first embodiment of this invention features an oxidation procedure in which germanium is segregated into the underlying silicon body resulting in the desired silicon-germanium body to be used to accommodate a subsequent overlying strained silicon layer. Removal of the oxidized material exposes the now formed underlying silicon-germanium crystalline ($Si_{1-x}Ge_x$) body wherein x is the weight percent of germanium in the $Si_{1-x}Ge_x$ layer. The desired strained silicon layer is next achieved via a selective epitaxial growth (SEG) procedure formed on the underlying exposed $Si_{1-x}Ge_x$ body.

A second embodiment of this invention features the formation of both tensile strained silicon-germanium and compressively strained silicon-germanium for the same MOSFET device. After deposition or sputtering of a polycrystalline silicon-germanium layer, photolithographic and dry etching procedures are used to thin a portion of the polycrystalline silicon germanium layer in a region of the MOSFET device to be used for P channel device fabrication. A subsequent oxidation procedure results in germanium segregation into the underlying silicon body with a greater level of germanium incorporated into the portion of silicon body underlying the unetched or thicker polycrystalline silicon-germanium layer, when compared to level of germanium incorporated into the portion of silicon body underlying the thinner polycrystalline silicon-germanium layer. Removal of oxidized material followed by SEG of a thin silicon-germanium layer, with the chosen [Ge] concentration between the two underlying substrates concentration, will result in a silicon-germanium layer featuring tensile strain overlying the silicon-germanium body with the greater germanium incorporation while a compressively strained silicon-germanium layer is grown on the silicon body having the lower germanium concentration. The top layers for all regions will be designated as $SiGe_z$ while $SiGe_x$ and $SiGe_y$ will be the two underlying layers, z chosen to be x<z<y. Subsequent MOSFET processing such as gate insulator growth, conductive gate structure formation, source/drain formation, result in a MOSFET device featuring either PMOS, NMOS or CMOS devices.

A third embodiment of this invention features the growth of a thin silicon layer on underlying layers $SiGe_x$ and $SiGe_y$, with the silicon layer featuring tensile strain overlying the silicon-germanium body ($SiGe_y$) with greater germanium concentration while a compressively strained silicon-germanium layer is grown on the silicon-germanium body ($SiGe_x$) having the lower germanium concentration.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
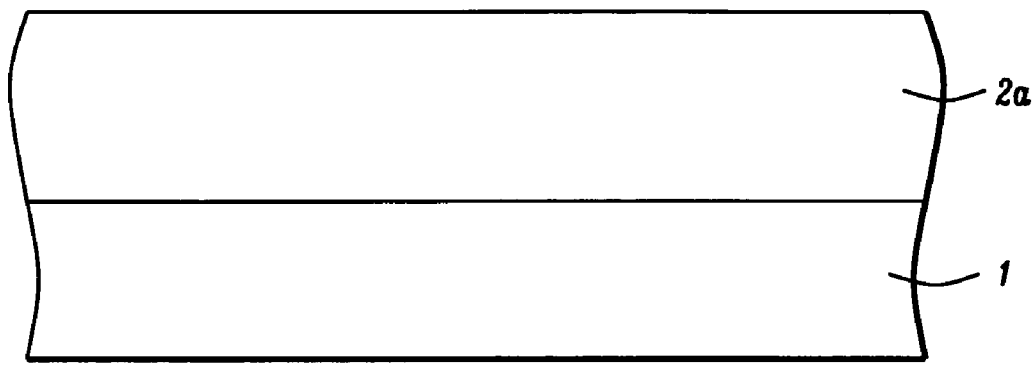
FIGS. 1-10, which schematically in cross-sectional style show key stages of fabrication for either a tensile or compressive strained silicon layer on an underlying silicon-germanium body, formed after STI formation.

The method of forming strained silicon layers on an underlying silicon-germanium body for incorporation of MOSFET channel regions, wherein the strained silicon regions and underlying silicon-germanium body were formed after formation of specific device features such as shallow trench isolation (STI) structures, will now be described in detail. Semiconductor substrate 1, shown schematically in FIG. 1, is comprised of single crystalline, P type silicon, featuring a <100> crystallographic orientation. The substrate orientation is not critical for this invention and thus can be any orientation if desired without detracting from the spirit of this invention. If desired a silicon on oxide (SOI) layer 2a, can be formed on semiconductor substrate 1, to reduce capacitance and enhance performance of subsequently formed devices. This invention will be described using the SOI option with silicon layer 2a, at a thickness between about 100 Angstroms to 0.5 μm, (100 Angstroms will be called an ultra-thin body and will be a fully depleted body while SOI at a thickness of about 0.5 μm will be a partially depleted body). Layer 1, can also be a buried oxide layer for example with a thickness between about 1000 Angstroms to 1 μm. Not shown in the drawings are N well and P well regions formed in SOI layer 2a, to accommodate the PMOS and NMOS devices. The well regions can be or doped, with doped regions formed via ion implantation of specific ions such as boron, arsenic phosphorous, indium, or antimony, followed by high temperature annealing to activate the implanted ions. It is imperative to form the well regions prior to forming the strained silicon and underlying silicon-germanium bodies since the high temperature processes of well formation would result in unwanted out gassing of germanium from silicon-germanium materials.

Figure 2:
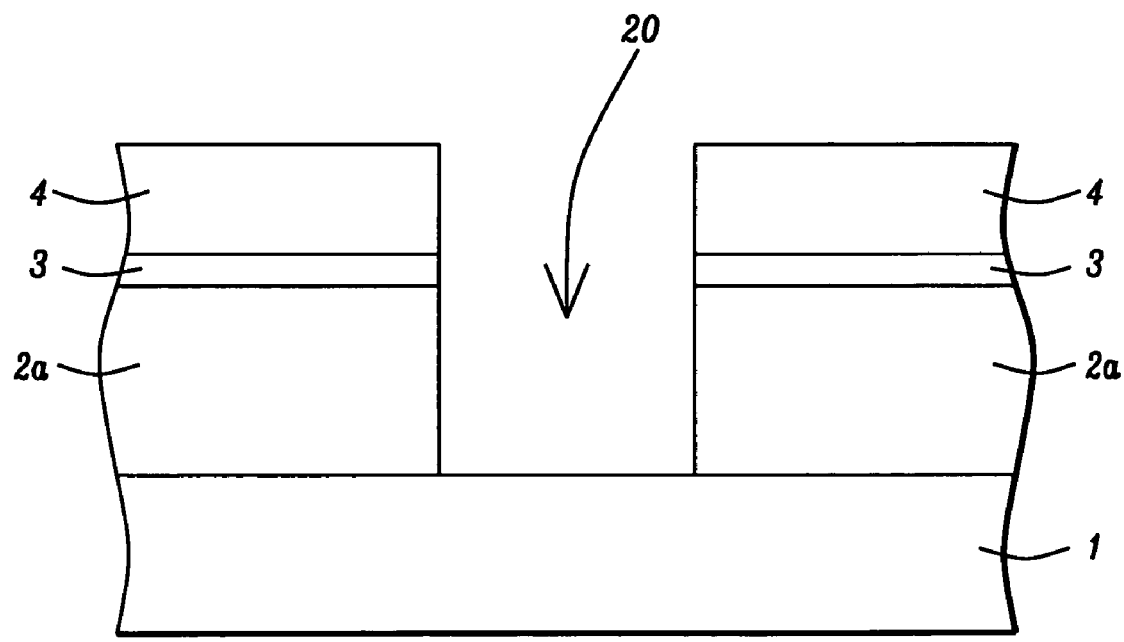

Formation of a shallow trench isolation (STI) structure is next addressed and schematically shown using FIGS. 2-6. The process steps, dry etching, liner formation, etc, could again deleteriously influence the integrity of a strained silicon layer as well as an underlying silicon-germanium body, therefore the STI structure is formed prior to formation of these layers. Silicon oxide layer 3, to be used as a pad oxide, is first obtained at a thickness between about 50 to 150 Angstroms, preferably at 100 Angstroms, via thermal oxidation procedures. This is followed by deposition of silicon nitride layer 4, at a thickness between about 500 to 1500 Angstroms, preferably at 1000 Angstroms, via low pressure chemical vapor deposition (LPCVD) or via plasma enhanced chemical vapor deposition (PECVD) procedures. The use of an anti-reflective coating film overlying silicon nitride layer 4, prior to photolithographic processing is optional. Photolithographic and selective anisotropic reactive ion etching (RIE) procedures, are then applied to define shallow trench shape 20, in silicon nitride layer 4, in silicon oxide layer 3, and in the entire or in a top portion of SOI layer 2a. This is schematically shown in FIG. 2. The anisotropic RIE procedure is performed using $Cl_2$ or $CF_4$ as an etchant for silicon nitride, $CHF_3$ as an etchant for silicon oxide, and $Cl_2$ or $SF_6$ as an etchant for silicon, and the chemistry or mixed chemistry chosen for etching of each layer is not limited to the above. Shallow trench shape 20, is formed in the entire thickness of SOI layer 2a, to a depth between about 100 to 3500 Angstroms. (For a body thickness <3500 Angstroms the depth is all reach through, for >3500 Angstroms in body thickness the thickness of 3500 Angstroms is fixed, just like the formation in the bulk silicon. If desired shallow trench shape 20, can be formed only in top portion of SOI layer 2a, terminating in a bottom portion of SOI layer 2a).

Figure 3:
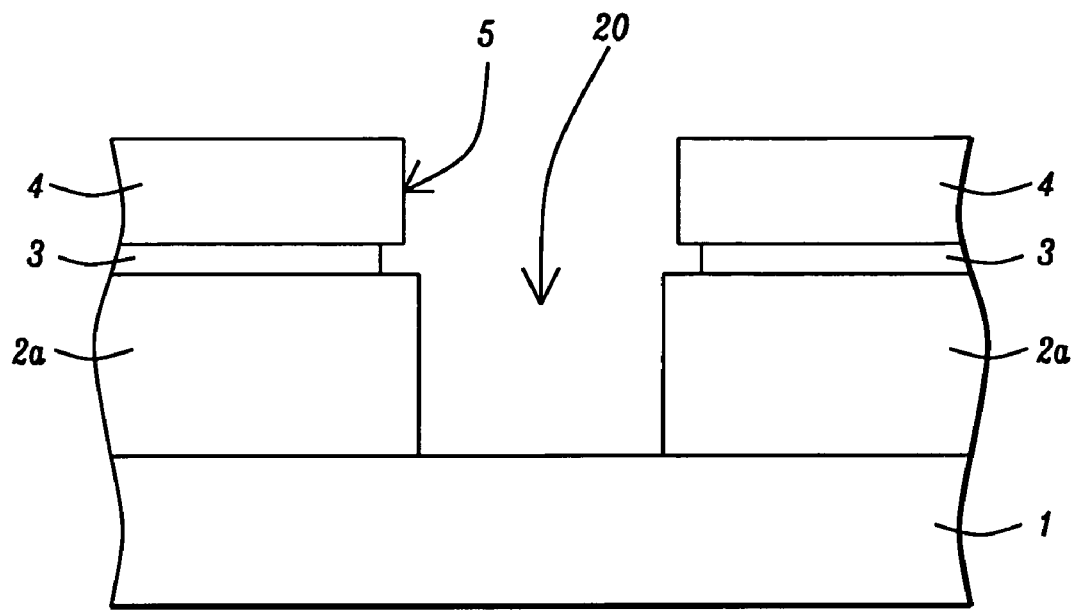

With a photoresist shape (not shown in the drawings) used to define shallow trench shape 20, still in place lateral pullback 5, of exposed portions of silicon nitride layer 4, is performed. This is accomplished via an isotropic dry etch procedure using $Cl_2$ or $CF_4$ as an etchant, or via a wet etch procedure using hot phosphoric acid as an etchant for silicon nitride. Pullback 5, shown schematically in FIG. 3, is between about 100 to 200 Angstroms. Removal of the shallow trench defining photoresist shape is now accomplished via plasma oxygen ashing procedures followed by wet clean procedures. A buffered hydrofluoric acid component used in the wet clean procedure results in removal of portions of silicon oxide layer 3, exposed after the silicon nitride pullback procedure resulting in an additional silicon oxide pull back of between about 100 to 200 Angstroms from silicon nitride layer 4. The result of these procedures is schematically shown in FIG. 3.

Figure 4:
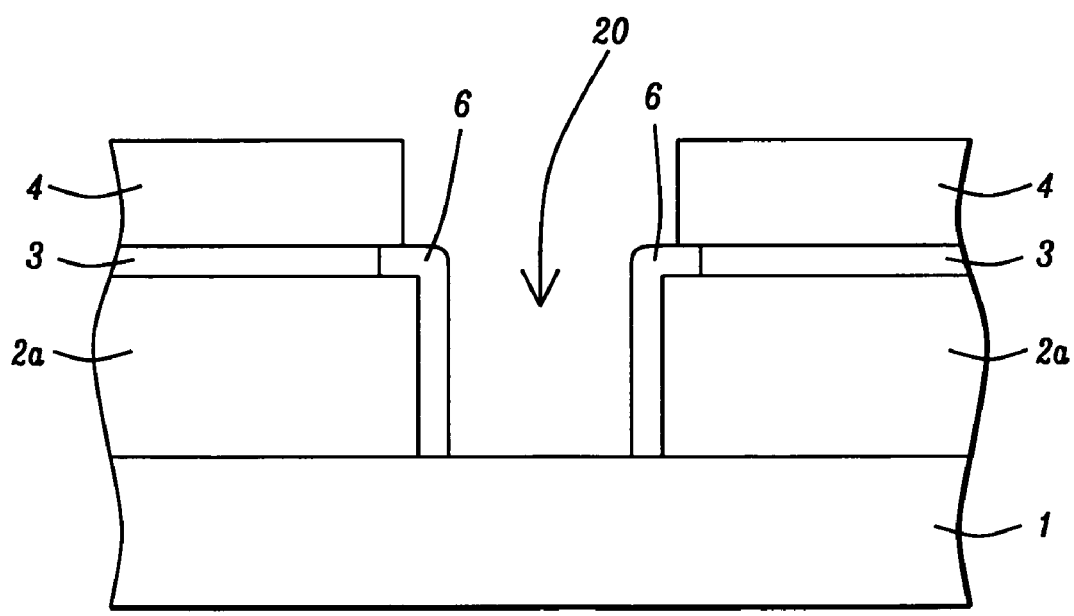

To repair the etched trench sidewall surfaces and also protect exposed surfaces of SOI layer 2a, from a subsequent chemically deposited insulator layer used to fill shallow trench shape 20, liner layer 6, is formed to a thickness between about 100 to 400 Angstroms, preferably at 200 Angstroms. Liner layer 6, shown schematically in FIG. 4, is comprised of silicon dioxide formed via a thermal oxidation procedure performed at a temperature between about 900 to 1200° C., preferably at 1100° C. The thickness of silicon dioxide liner layer 6, is optimized to satisfy the corner rounding required by the subsequently formed devices. Silicon-germanium layers if exposed to the above high temperature oxidation procedure would be deleteriously altered as a result of germanium out gassing, and poor silicon-germanium oxide quality.

Figure 5:
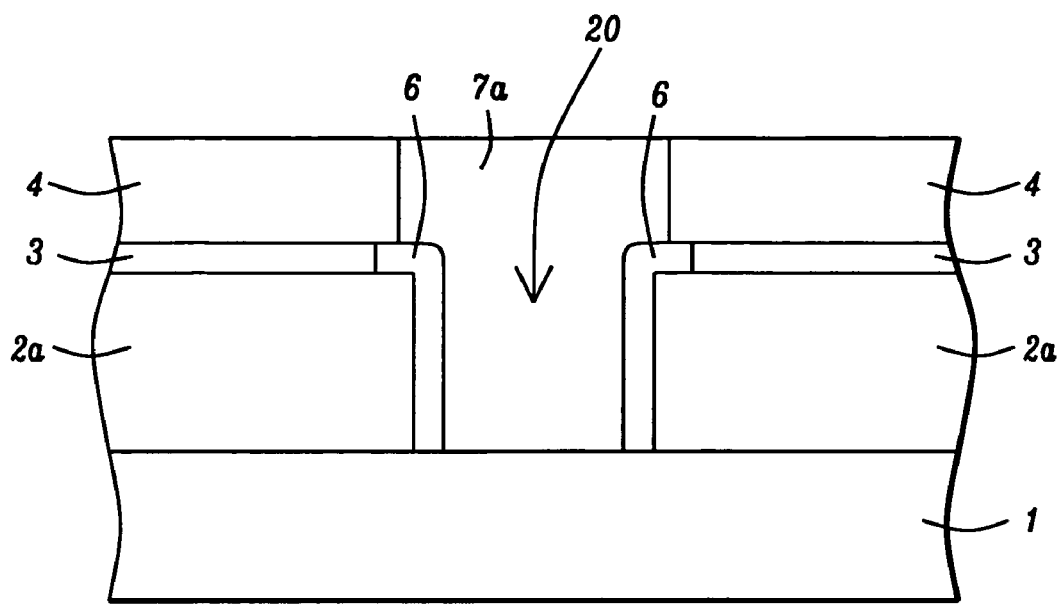
Figure 6:
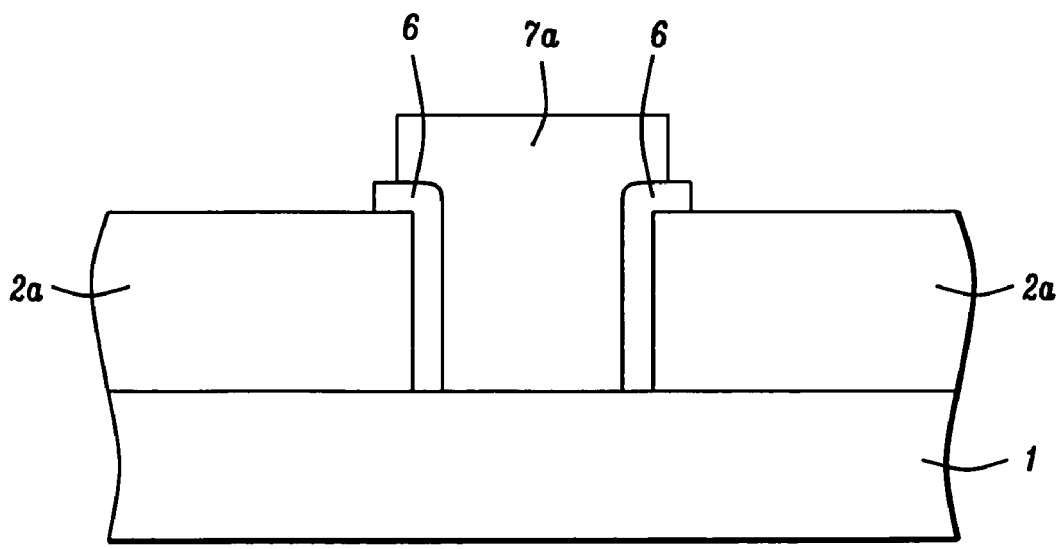

Insulator layer 7a, comprised of silicon oxide is next deposited via LPCVD, PECVD or via (HDP) high density plasma deposition procedures to a thickness between about 5000 to 8000 Angstroms, completely filling shallow trench shape 20. Removal of unwanted portions of silicon oxide layer 7a, from the top surface of silicon nitride layer 4, is accomplished via a CMP procedure for better planarized surface. If desired a RIE procedure can be employed using $CHF_3$ as a selective etchant for silicon oxide layer 7a, with the selective RIE procedure terminating at the appearance of the top surface of silicon nitride layer 4. This is schematically shown in FIG. 5. Silicon nitride layer 4 and silicon oxide layer 3, is next selectively removed preferably via a hot phosphoric acid treatment resulting in the silicon oxide filled shallow trench opening shown schematically in FIG. 6. Alternately a selective RIE procedure may be utilized.

Figure 7:
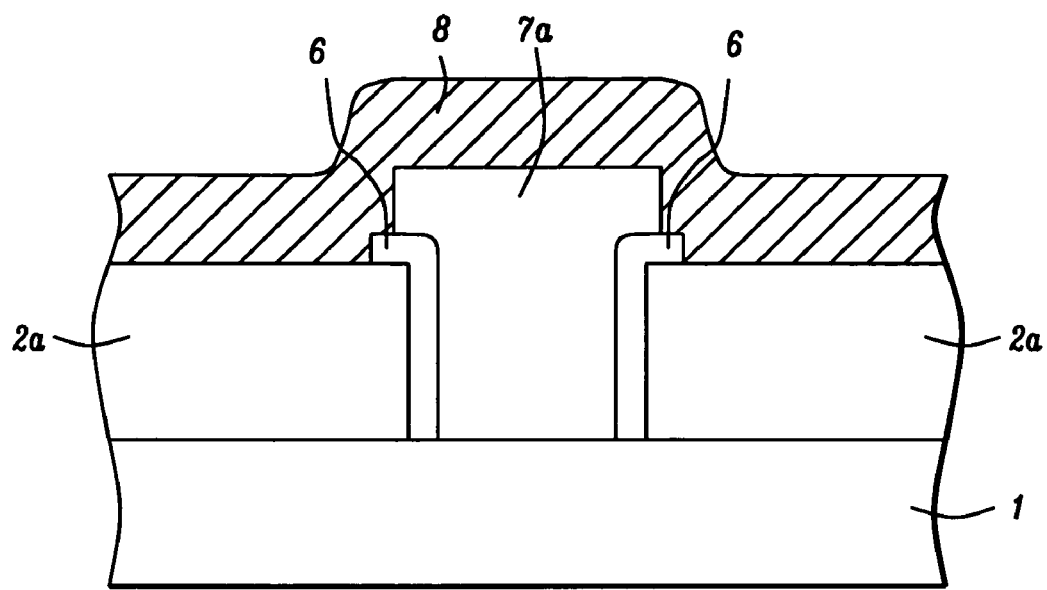

Careful wet clean procedures using BHF as a component are next employed to prepare exposed surfaces of SOI layer 2a, for deposition of $Si_{1-x}Ge_x$ layer 8. $Si_{1-x}Ge_x$ layer 8, wherein x is the weight percent of germanium, can be obtained via a low temperature chemical vapor deposition (LPCVD) procedure using the identical apparatus used for polysilicon deposition. The LPCVD procedure is performed at a temperature between about 500 to 700° C., preferably at 600° C., using silane or disilane as a source for the silicon component of $Si_{1-x}Ge_x$ layer 8, while germane is employed as a source for the germanium component. Germanium weight percent x, is adjusted via flow rate levels of silane and germane. $Si_{1-x}Ge_x$ layer 8, shown schematically in FIG. 7, is deposited to a thickness between about 500 to 1500 Angstroms, preferably at 1000 Angstroms, with a germanium weight percent between about 10% to 70%. If desired $Si_{1-x}Ge_x$ layer 8, can be obtained via d.c. or r.f, sputtering procedures, for this case a target comprised with only a specific percent of silicon and of germanium can be employed. Alternately, silicon epitaxial growth (SEG) could be used to form $Si_{1-x}Ge_x$ layer 8.

Figure 8:
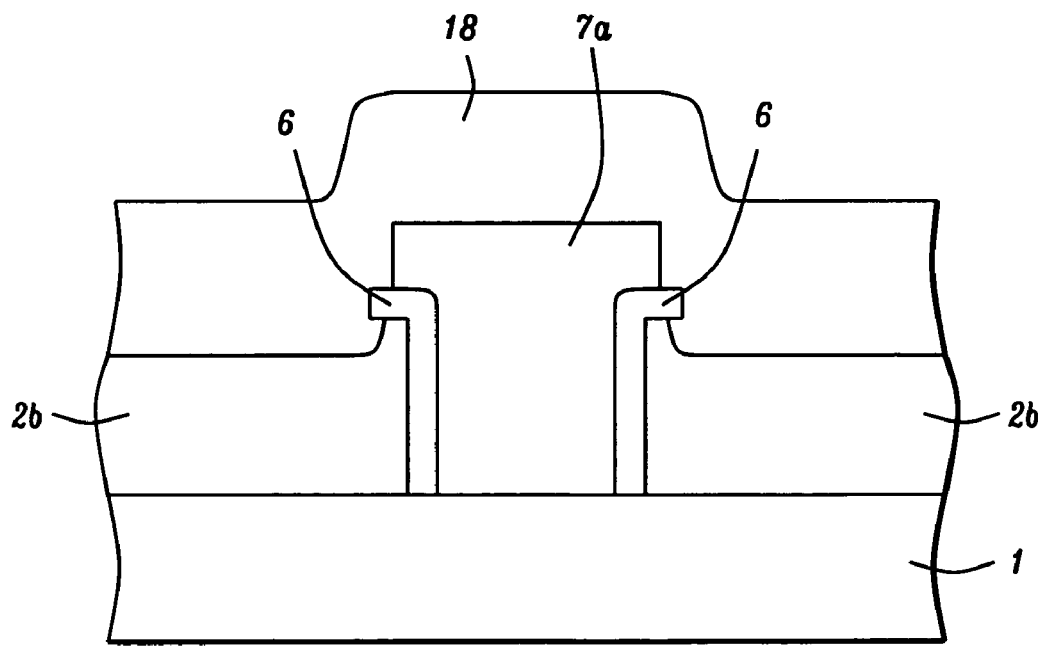
Figure 9:
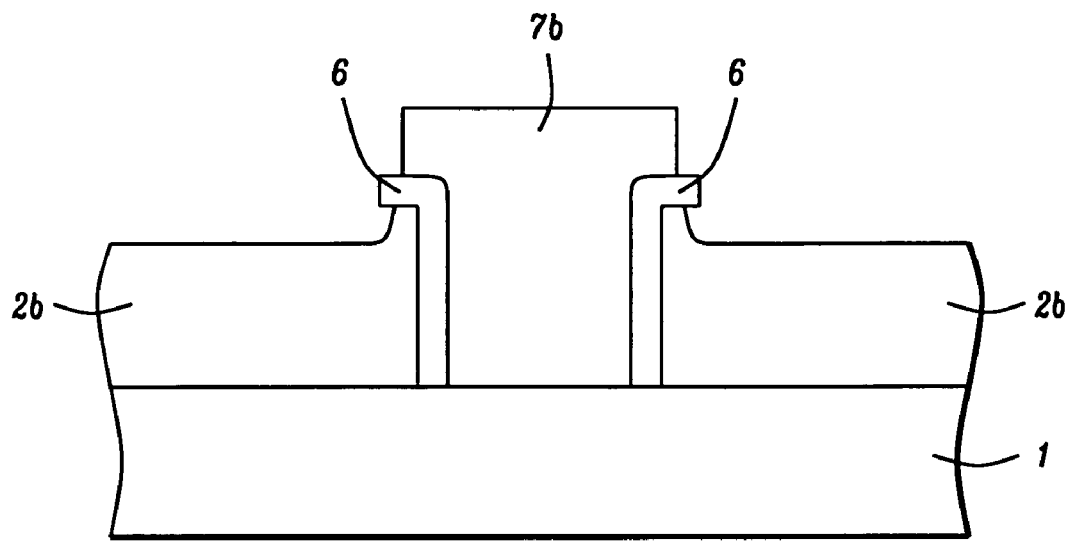

A critical oxidation procedure is next performed in an oxygen-steam ambient at a temperature between about 900 to 1100° C. This temperature is selected to be less than the melting point of $Si_{1-x}Ge_x$, wherein the melting point decreases with increasing x. The oxidation procedure in addition to converting the silicon component of $Si_{1-x}Ge_x$ layer 8, to silicon oxide layer 18, also allows segregation of germanium into the underlying SOI layer. The resulting underlying SOI layer is now single crystalline $Si_{1-x}Ge_x$ body 2b, comprised with a weight percent of germanium between about 10% up to >90%. This is schematically shown in FIG. 8. Selective removal of silicon oxide layer 18, is next accomplished via a wet BHF procedure, which results in a thinner silicon oxide component 7b, filling the shallow trench shape. This is schematically shown in FIG. 9. Single crystalline $Si_{1-x}Ge_x$ body 2b, comprised with a desired germanium weight content is now in the correct form to allow growth of overlying strained silicon layer to proceed.

Figure 10:
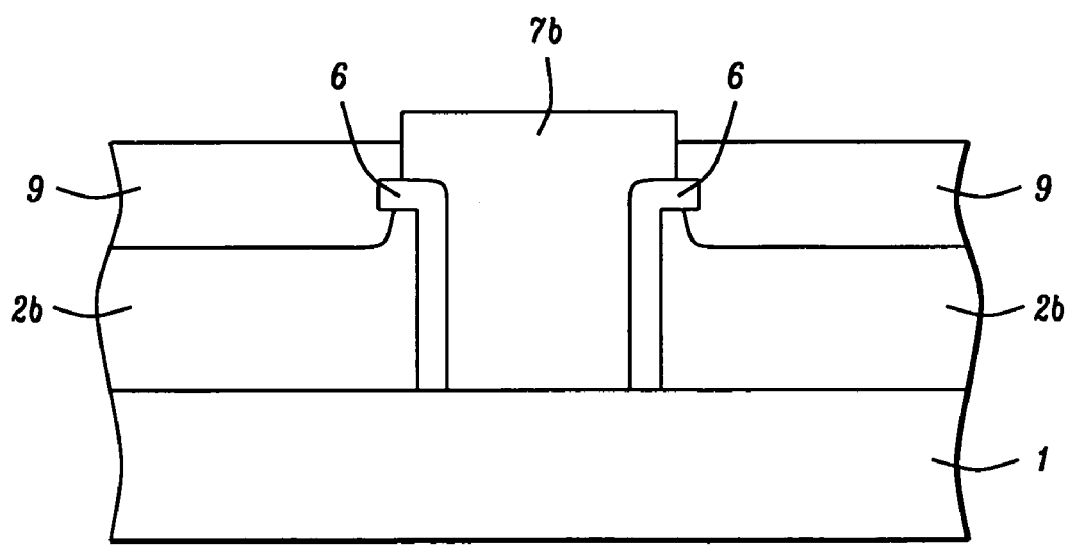

A selective epitaxial growth (SEG) procedure is next employed to grow single crystalline silicon or silicon-germanium layer 9, on exposed top surfaces of single crystalline $Si_{1-x}Ge_x$ body 2b. The SEG procedure is performed at a temperature between about 500 to 700° C., preferably at 600 to 650° C., using silane or disilane for the silicon option, while adding germane for a silicon-germanium option. Single crystalline silicon layer 9, shown schematically in FIG. 10, is selectively grown at a thickness between about 50 to 200 Angstroms, preferably at 100 Angstroms as channel thickness demands, only on exposed top surfaces of single crystalline $Si_{1-x}Ge_x$ body 2b. The ability to grow the above layer on underlying single crystalline $Si_{1-x}Ge_x$ body 2b, results in a tensile strained silicon layer 9. The magnitude of tensile strain is a function of the weight percent of germanium in underlying single crystalline $Si_{1-x}Ge_x$ body 2b. Strained silicon layer 9, will now be used to accommodate a MOSFET channel region with enhanced carrier mobility thus resulting in enhanced MOSFET performance. The MOSFET device is completed via: formation of a gate insulator layer on strained silicon layer 9; depositing and definition of a conductive gate structure on the underlying gate insulator layer; and formation of a source/drain region in regions of strained silicon layer 9, not covered by the conductive gate structure.

Figure 11:
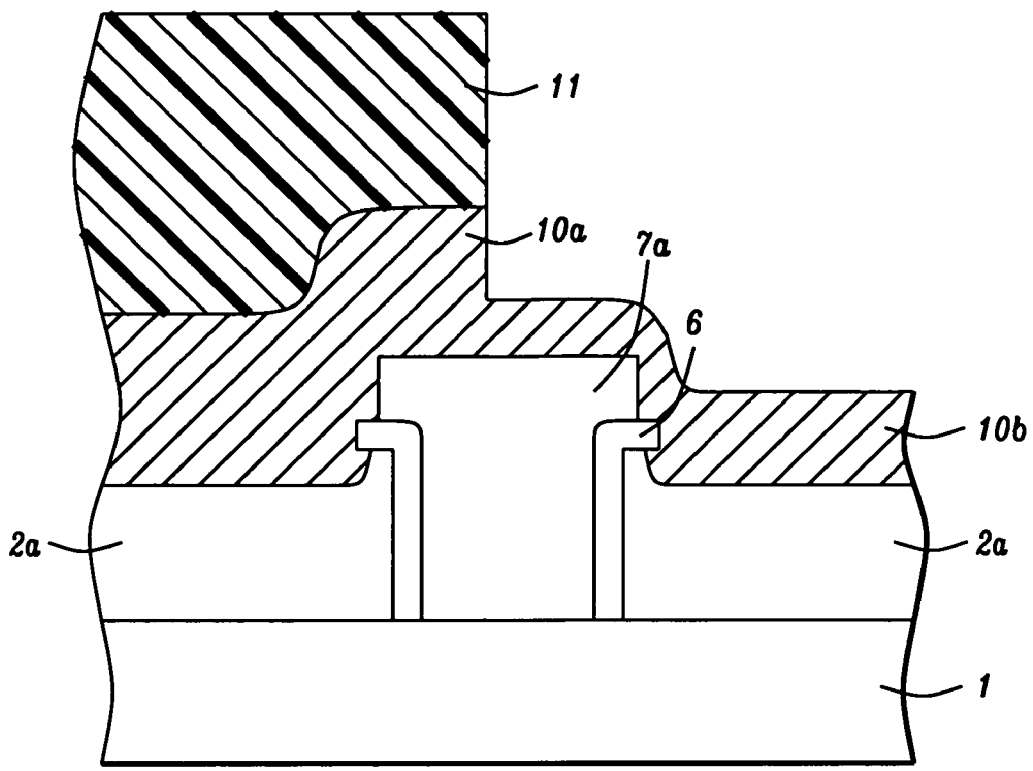
FIGS. 11-14, which schematically in cross-sectional style show key stages for integration of both tensile and compressive strained layers on a underlying silicon-germanium body, again formed after STI formation.

A second embodiment of this invention teaches a process which allows a first portion of a silicon-germanium layer to be selectively formed with tensile strain while a second portion of the same selectively grown silicon-germanium layer is formed with compressive strain. Referring to FIG. 11, with the insulator filled STI structure in place and using the structure of FIG. 6 as a starting point, $Si_{1-x}Ge_x$ layer 10a, is deposited wherein x is the weight percent of germanium. $Si_{1-x}Ge_x$ layer 10a, can again be obtained via a low temperature chemical vapor deposition (LPCVD) procedure using the identical apparatus used for polysilicon deposition. The LPCVD procedure is performed at a temperature between about 500 to 700° C., using silane or disilane as a source for the silicon component of $Si_{1-x}Ge_x$ layer 10a, while using germane as a source for the germanium component. Germanium weight percent x, is adjusted via flow rate levels of silane and germane. $Si_{1-x}Ge_x$ layer 10a, is deposited to a thickness between about 500 to 1500 Angstroms, preferably at 1000 Angstroms, with a germanium weight percent between about 10% to 70%. If desired $Si_{1-x}Ge_x$ layer 10a, can be obtained via d.c. or r.f sputtering procedures. Photoresist shape 11, is next formed and used as an etch mask to allow removal or partial removal of a top portion of $Si_{1-x}Ge_x$ layer 10a. A RIE procedure employed using $Cl_2$ or $SF_6$ as an etchant results in the attainment of thinner $Si_{1-x}Ge_x$ layer 10b, now at a thickness between about 0 to 500 Angstroms, overlying a second portion of SOI layer 2a. Unetched portions of $Si_{1-x}Ge_x$ layer 10a, at a thickness between about 500 to 1500 Angstroms remain overlying a first portion of SOI layer 2a. An option for a hybrid structure is the thinning of layer 10a, to where the thickness of layer 10b, is 0 Angstroms (i.e., total removal), resulting in no germanium entering underlying region 2a. This could be used for the subsequent formation of, for example, leakage sensitive devices or the like.

Figure 12:
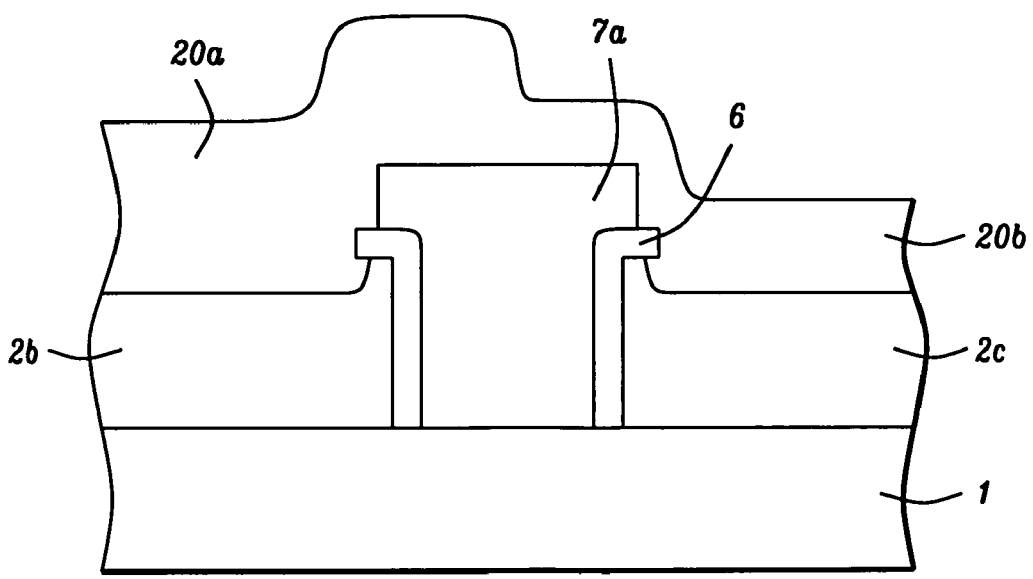

After removal of photoresist shape 11, via plasma oxygen ashing and wet clean procedures a critical oxidation procedure is performed in an oxygen-steam ambient at a temperature between about 900 to 1000° C. The oxidation procedure is employed to completely convert the unetched $Si_{1-x}Ge_x$ layer 10a, to silicon oxide layer 20a, and to completely convert thinner $Si_{1-x}Ge_x$ layer 10b, to silicon oxide layer 20b. The oxidation procedure again results in segregation of germanium into underlying SOI layer 2a. The extent of Ge segregation into the underlying SOI layer 2a, is a function of the thickness or amount of germanium in the overlying pre-oxidized $Si_{1-x}Gex$ layer. Since $Si_{1-x}Ge_x$ layer 10b, is thinner than the unetched $Si_{1-x}Ge_x$ layer 10a, less germanium segregation into the underlying SOI layer occurs when compared to the level of germanium segregation into the portion of SOI layer 2a, underlying $Si_{1-x}Ge_x$ layer 10a with full as-deposited thickness. The oxidation procedure of $Si_{1-x}Ge_x$ layer 10a, at a pre-oxidized thickness between about 600 to 800 Angstroms, (with [Ge] at 50% as an example), allows germanium segregation to occur in underlying single crystalline body $Si_{1-x}Ge_x$ 2b, wherein x is the weight percent of germanium in single crystalline body $Si_{1-x}Ge_x$ 2b, is between about 60 to 80 percent, resulting in a final thickness of about 500 Angstroms. The same oxidation procedure applied to thinner $Si_{1-x}Ge_x$ layer 10b, results in single crystalline $Si_{1-x}Ge_x$ body 2c, wherein the weight percent of germanium is only between about 20% to 40%. This is schematically shown in FIG. 12.

Figure 13:
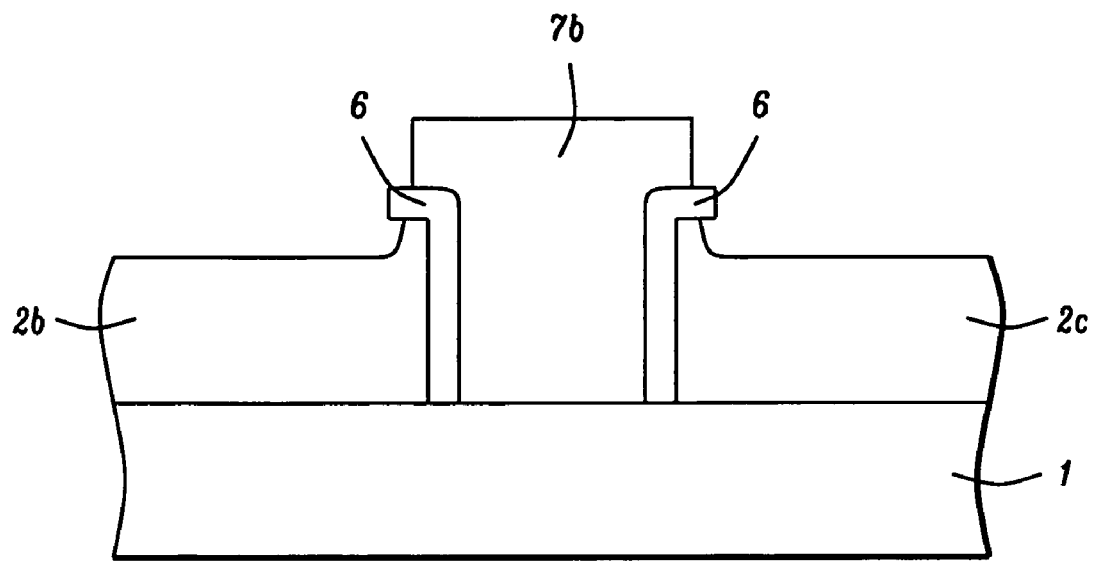

Selective removal of silicon oxide layer 20a, and of 20b, is next accomplished via a wet BHF procedure. This procedure also results in thinning of the silicon oxide shape of the STI structure resulting in thinner silicon oxide component 7b. This is schematically shown in FIG. 13.

Figure 14:
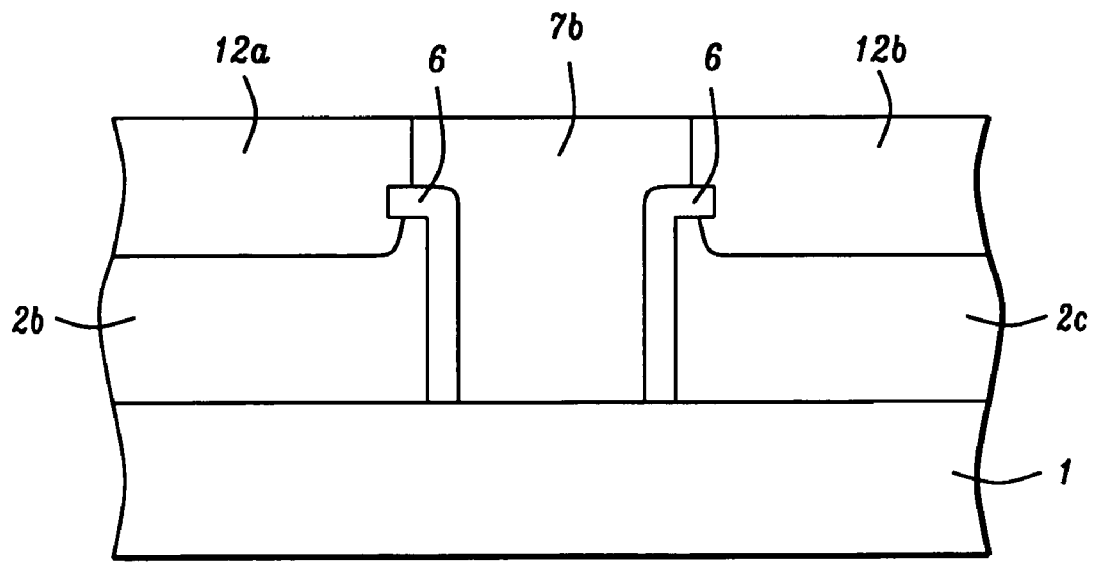

The selective epitaxial growth (SEG) procedure previously described in this first embodiment of this invention is again employed to grow single crystalline silicon-germanium layers on exposed top surfaces of single crystalline $Si_{1-x}Ge_x$ body 2b, and $Si_{1-x}Ge_x$ body 2c. The SEG procedure is performed at a temperature between about 500 to 700° C., preferably at 600° C. The silicon-germanium layer is achieved via the addition of germane to either a silane or disilane flow. Single crystalline silicon-germanium $(Si_{1-z}Ge_z)$ layer 12a, at a thickness between about 50 to 200 Angstroms (thinner than the underlying substrate), preferably at 100 Angstroms, is selectively grown on underlying $Si_{1-x}Ge_x$ body 2b, and is comprised with a tensile strain. The tensile strain featured in single crystalline silicon-germanium layer 12a, is achieved via selective epitaxial growth on an underlying $Si_{1-x}Ge_x$ body 2b, comprised with a germanium weight percent between about 60% to 80%. The tensile strain of single crystalline silicon-germanium layer 12a, will allow enhancement of electron mobility to be realized thus enhancing the performance of subsequently fabricated NMOS devices. The same SEG procedure results in the selective growth of single crystalline silicon-germanium($Si_{1-z}Ge_z$) layer 12b, on underlying $Si_{1-x}Ge_x$ body 2c. However single crystalline silicon-germanium layer 12b, is comprised with compressive strain as a result of growth on underlying $Si_{1-x}Ge_x$ body 2c, which is comprised with a lower germanium weight percent between about 20 to 40 weight percent, than counterpart $Si_{1-x}Ge_x$ body 2b, because x<z. The compressive nature of single crystalline silicon-germanium layer 12b, will allow enhancement of hole mobility to be realized thus enhancing the performance of subsequently fabricated PMOS devices. The result of the SEG procedure is schematically shown in FIG. 14.

A third embodiment of this invention features the growth of a single crystalline layer ($Si_{1-z}Ge_z$) 12a and 12b, on underlying layers $Si_{1-x}Ge_x$ 2c and $Si_{1-y}Ge_y$ 2b, wherein the germanium content [z] is zero weight percent. Silicon layer 12a, featuring tensile strain is grown overlying the silicon-germanium body ($Si_{1-y}Ge_y$ 2b) comprised with the greater germanium incorporation, while compressively strained silicon layer 12b is grown on the silicon-germanium body ($Si_{1-x}Ge_x$ 2c) having the lower germanium concentration.

Complimentary metal oxide semiconductor (CMOS) devices can now be formed wherein NMOS devices can be formed in with enhanced electron mobility in single crystalline silicon layer 12a, while counterpart PMOS devices can be formed with enhanced hole mobility in single crystalline silicon layer 12b. The completion of the CMOS devices feature: gate insulator layer formed on both single crystalline silicon layer 12a and 12b; definition of a conductive gate structure on the underlying gate insulator layer; and formation of an N type and P type source/drain region in regions of the strained silicon-germanium layers not covered by the conductive gate structure. The ability to form the $Si_{1-x}Ge_x$ bodies and the overlying strained silicon layers after STI formation and after high temperature processing did not allow the integrity of the above layers to be degraded.

While this invention has been particularly shown and described with reference to, the preferred embodiments thereof, it will be understood by those skilled in the art that various changes in form and details may be made without departing from the spirit and scope of this invention.

What is claimed is:

1. A method of integrating the formation of a tensile strained silicon layer and of a compressive strained silicon layer on underlying semiconductor alloy bodies, performed after formation of insulator filled, shallow trench isolation (STI) structures, comprising the steps of:
  providing a single crystalline silicon body;
  forming said insulator filled, STI structure in a top portion of said single crystalline silicon body;
  depositing a silicon-germanium ($Si_{1-x}Ge_x$) layer;
  performing a patterning procedure to thin a second portion of said $Si_{1-x}Ge_x$ layer in a region in which said second portion of said $Si_{1-x}Ge_x$ layer overlays a second portion of said single crystalline silicon body, while a first portion of said $Si_{1-x}Ge_x$ layer located overlying a first portion of said single crystalline silicon body remains unetched;
  performing an oxidation procedure to convert the unetched first portion of said $Si_{1-x}Ge_x$ layer and thinned second portion of said $Si_{1-x}Ge_x$ layer to silicon oxide, converting said first single crystalline silicon body to a first single crystalline $Si_{1-x}Ge_x$ body comprised with a first weight percent of germanium, and converting said second single crystalline silicon body to a second single crystalline $Si_{1-x}Ge_x$ body comprised with a second weight percent of germanium;
  removing said silicon oxide layer; and
    selectively forming said tensile strained silicon layer on said first single crystalline $Si_{1-x}Ge_x$ body and forming said compressive strained silicon layer on said second single crystalline $Si_{1-x}Ge_x$ body.

2. The method of claim 1, wherein said single crystalline semiconductor body is a single crystalline silicon substrate comprised with a <100> crystallographic orientation.

3. The method of claim 1, wherein said single crystalline semiconductor body is a silicon on insulator (SOI) layer, comprised with a thickness between about 100 Angstroms to 0.5 μm.

4. The method of claim 1, wherein said insulator filled, STI structure is a silicon oxide filled STI structure, wherein the depth of said STI structure in said single crystalline semiconductor body is between about 100 to 3500 Angstroms.

5. The method of claim 1, wherein said silicon-germanium $Si_{1-x}Ge_x$) layer, wherein x is the content of germanium in $Si_{1-x}Ge_x$ is comprised with a weight percent of germanium between about 10 to 70.

6. The method of claim 1, wherein said $Si_{1-x}Ge_x$ layer is obtained at a thickness between about 500 to 1500 Angstroms via chemical vapor deposition procedures such as a low temperature chemical vapor deposition (LPCVD) procedure.

7. The method of claim 1, wherein said $Si_{1-x}Ge_x$ layer is obtained at a thickness between about 500 to 1500 Angstroms via sputtering procedures.

8. The method of claim 1, wherein said patterning procedure is performed using a reactive ion etching (RIE) procedure employed using $Cl_2$ or $SF_6$ as an etchant.

9. The method of claim 1, wherein said thin second portion of said $Si_{1-x}Ge_x$ layer is comprised with a thickness between about 0 to 500 Angstroms.

10. The method of claim 1, wherein said oxidation procedure is a thermal oxidation procedure performed at a temperature between about 900 to 1100° C., in an oxygen-steam ambient.

11. The method of claim 1, wherein said first single crystalline $Si_{1-x}Ge_x$ body is comprised with said first weight percent of germanium between about 60% to 80%.

12. The method of claim 1, wherein said second single crystalline $Si_{1-x}Ge_x$ body is comprised with said second weight percent of germanium between about 20% to 40%.

13. The method of claim 1, wherein strained silicon layers are single crystalline silicon layers obtained via selective epitaxial growth (SEG) procedures to a thickness between about 50 to 200 Angstroms.

* * * * *

UNITED STATES PATENT AND TRADEMARK OFFICE
CERTIFICATE OF CORRECTION

PATENT NO.       : 7,439,165 B2                                         Page 1 of 1
APPLICATION NO.  : 11/100206
DATED            : October 21, 2008
INVENTOR(S)      : Patrick Guo Qiang Lo et al.

It is certified that error appears in the above-identified patent and that said Letters Patent is hereby corrected as shown below:

On the title page, item [75]:
In the Inventors, (75), delete first Inventor, "Patrick Guo Oiang Lo, Singapore (SG)" and replace with -- Patrick Guo Qiang Lo, Singapore (SG) --.

Signed and Sealed this

Seventeenth Day of February, 2009

JOHN DOLL
*Acting Director of the United States Patent and Trademark Office*